United States Patent
Chiu et al.

(10) Patent No.: US 7,148,114 B2
(45) Date of Patent: Dec. 12, 2006

(54) PROCESS FOR PATTERNING HIGH-K DIELECTRIC MATERIAL

(75) Inventors: Hsien-Kuang Chiu, Hsinchu (TW); Baw-Ching Perng, Hsinchu (TW); Hun-Jan Tao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/101,774

(22) Filed: Apr. 8, 2005

(65) Prior Publication Data

US 2005/0181590 A1 Aug. 18, 2005

Related U.S. Application Data

(63) Continuation of application No. 10/608,349, filed on Jun. 27, 2003, now Pat. No. 7,037,849.

(51) Int. Cl.
*H01L 21/336* (2006.01)
(52) U.S. Cl. .............. 438/287; 438/745; 438/749; 438/753; 257/E21.246
(58) Field of Classification Search ............ 438/287, 438/745, 749, 753; 257/E21.246
See application file for complete search history.

(56) References Cited

U.S. PATENT DOCUMENTS

| | | | |
|---|---|---|---|
| 5,246,888 A * | 9/1993 | Miyamoto ............ | 438/714 |
| 5,316,616 A * | 5/1994 | Nakamura et al. ........ | 438/713 |
| 6,444,512 B1 | 9/2002 | Madhukar et al. | |
| 6,495,473 B1 | 12/2002 | Taniyama et al. | |
| 6,504,214 B1 | 1/2003 | Yu et al. | |
| 6,511,872 B1 | 1/2003 | Donnelly, Jr. et al. | |
| 6,511,876 B1 | 1/2003 | Buchanan et al. | |
| 6,528,858 B1 | 3/2003 | Yu et al. | |
| 6,531,368 B1 | 3/2003 | Yu | |
| 6,656,852 B1 | 12/2003 | Rotondaro et al. | |
| 2003/0114014 A1 * | 6/2003 | Yokoi et al. ............ | 438/745 |

FOREIGN PATENT DOCUMENTS

| | | |
|---|---|---|
| TW | 479321 | 3/2002 |
| TW | 519696 | 2/2003 |

OTHER PUBLICATIONS

Wolf, S., "Silicon Processing for the VLSI Era," vol. 4: Deep Submicron Process Technology, Lattice Press, Sunset Beach, CA, 2002, pp. 145-180.

* cited by examiner

*Primary Examiner*—Fernando L. Toledo
(74) *Attorney, Agent, or Firm*—Slater & Matsil, L.L.P.

(57) ABSTRACT

A method of patterning a layer of high-k dielectric material is provided, which may be used in the fabrication of a semiconductor device. A first etch is performed on the high-k dielectric layer. A portion of the high-k dielectric layer being etched with the first etch remains after the first etch. A second etch of the high-k dielectric layer is performed to remove the remaining portion of the high-k dielectric layer. The second etch differs from the first etch. Preferably, the first etch is a dry etch process, and the second etch is a wet etch process. This method further includes a process of plasma ashing the remaining portion of the high-k dielectric layer after the first etch and before the second etch.

20 Claims, 2 Drawing Sheets

PROCESS FOR PATTERNING HIGH-K DIELECTRIC MATERIAL

This application is a continuation of U.S. patent application Ser. No. 10/608,349, entitled "Process For Patterning High-k Dielectric Material," filed on Jun. 27, 2003, now U.S. Pat. No. 7,037,849, which application is incorporated herein by reference.

TECHNICAL FIELD

The present invention generally relates to the fabrication of semiconductor devices, and more particularly to a process of patterning high-k dielectric material.

BACKGROUND

High-k dielectric materials are dielectric materials having a dielectric constant (k) greater than that of silicon nitride (i.e., k>about 7). High-k dielectric materials are currently being considered and/or implemented for next generation integrated circuit applications, such as: (a) gate dielectric material to replace $SiO_2$ in advanced metal-oxide-semiconductor field-effect transistor (MOSFET) structures; (b) dielectric material in a capacitor structure of a DRAM device; and (c) dielectric in a capacitor structure of non-volatile ferroelectric RAM (FeRAM) devices, for example.

FIGS. 1–3 illustrate current processes for patterning a high-k dielectric layer 20 for the case where a high-k dielectric material is used as a gate dielectric for a MOSFET structure. FIG. 1 shows an initial unpatterned structure 22 having a gate conductor layer 24 (e.g., metal) over a high-k dielectric layer 20, which is over a substrate 26 (e.g., silicon). Typically, it is preferred to use a dry etch process (e.g., reactive ion etching, ion milling) for etching the gate conductor layer 24, e.g., to provide good profile and critical dimension control.

The methods of wet etching alone and dry etching alone to remove high-k dielectric material often do not provide high etch selectivity with respect to the underlying substrate 26. As a result these methods are likely to recess the substrate 26, as shown in FIG. 2, or damage the substrate 26, as shown in FIG. 3 (see damage areas 28). The recess of the substrate 26 (see e.g., FIG. 2) after etching the high-k dielectric layer 20 may have a depth 30 of about 11 to 12 nm, for example. Avoiding recess of the substrate 26 by stopping the dry etching sooner often causes damage 28 to the substrate 26, as illustrated in FIG. 3, which may cause problems for subsequent silicide formation, for example. Hence, there is a need for a method of removing the high-k dielectric material without these drawbacks.

SUMMARY OF THE INVENTION

The problems and needs outlined above are addressed by the present invention. In accordance with one aspect of the present invention, a method of fabricating a semiconductor device is provided. This method includes the following steps, the order of which may vary. A layer of high-k dielectric material over a substrate is provided. A layer of conductive material over the high-k dielectric layer is provided. The conductive layer is patterned. A first etch is performed on the high-k dielectric layer. A portion of the high-k dielectric layer being etched with the first etch remains after the first etch. A second etch of the high-k dielectric layer is performed to remove the remaining portion of the high-k dielectric layer. The second etch differs from the first etch.

The first and second etches of the high-k dielectric layer may be performed in alignment with the patterned conductive layer. Spacers may be provided along sidewalls of the patterned conductive layer. The first and second etches of the high-k dielectric layer may be performed, at least in part, in alignment with the spacers. The first etch may be a dry etch process. The dry etch process may be a reactive ion etching process using an etch chemistry including at least one of inert gas, chlorine, and fluorine, for example. The second etch may be a wet etch process. The wet etch process may use an etch chemistry comprising an inorganic acid. The inorganic acid may include at least one of a halogen acid, HF, and H2SO4, for example. The patterning of the conductive layer, the first etch, and the second etch may be performed in a same chamber. A plasma ashing of the remaining portion of the high-k dielectric layer may be performed after the first etch and before the second etch. The high-k dielectric material may include at least one of an aluminum oxide, a zirconium oxide, a hafnium oxide, a hafnium silicate, a zirconium silicate, a silicon nitride, a tantalum oxide, a barium strontium titanate, and a lead-lanthanum-zirconium-titanate, for example. Material properties of the remaining portion of the high-k dielectric layer may change during the first etch. The high-k dielectric layer may be provided using a process selected from a group consisting of chemical vapor deposition, metal-organic chemical vapor deposition, atomic layer deposition, atomic layer chemical vapor deposition, low pressure chemical vapor deposition, sputtering, and anodization, for example. The remaining portion of the high-k dielectric layer may have a first thickness after the first etch that is about half its initial thickness.

In accordance with another aspect of the present invention, a method of fabricating a semiconductor device is provided. This method includes the following steps, the order of which may vary. A layer of high-k dielectric material over a substrate is provided. A layer of conductive material over the high-k dielectric layer is provided. The conductive layer is patterned. A dry etch is performed on the high-k dielectric layer. A portion of the high-k dielectric layer being etched with the dry etch remains after the dry etch. A wet etch of the high-k dielectric layer is performed to remove the remaining portion of the high-k dielectric layer. This method may further include a process of plasma ashing the remaining portion of the high-k dielectric layer after the dry etch and before the wet etch.

In accordance with still another aspect of the present invention, a method of patterning a layer of high-k dielectric material is provided. This method includes the following steps, the order of which may vary. A first etch is performed on the high-k dielectric layer. A portion of the high-k dielectric layer being etched with the first etch remains after the first etch. A second etch of the high-k dielectric layer is performed to remove the remaining portion of the high-k dielectric layer. The second etch differs from the first etch. Preferably, the first etch is a dry etch process, and the second etch is a wet etch process. This method may further include a process of plasma ashing the remaining portion of the high-k dielectric layer after the first etch and before the second etch.

BRIEF DESCRIPTION OF THE DRAWINGS

The following is a brief description of the drawings, which show illustrative embodiments of the present invention and in which.

DETAILED DESCRIPTION OF ILLUSTRATIVE EMBODIMENTS

Figure 1:
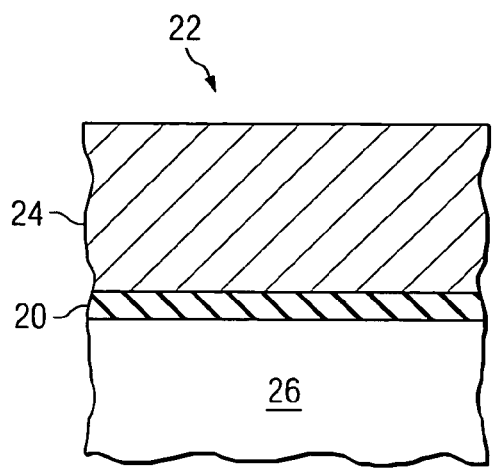
FIG. 1 is cross-section view of an initial stack of layers that may be used to form a gate for a transistor.

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 4:
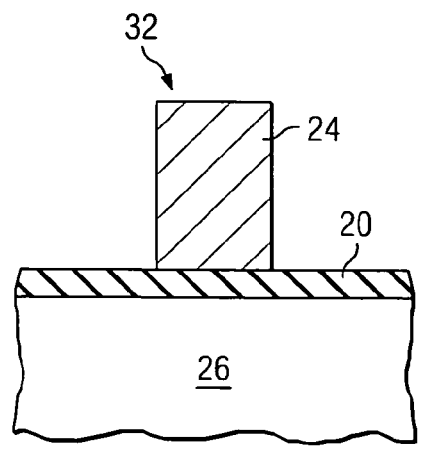
FIGS. 4–6 illustrate a method of patterning a high-k dielectric layer in accordance with a first embodiment of the present invention.
Figure 5:
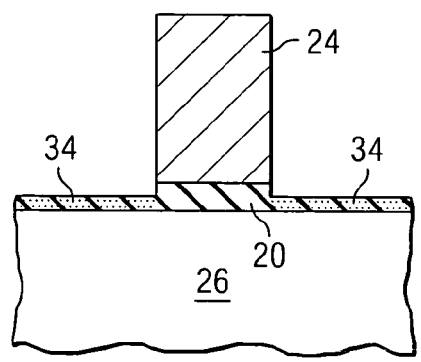
Figure 6:
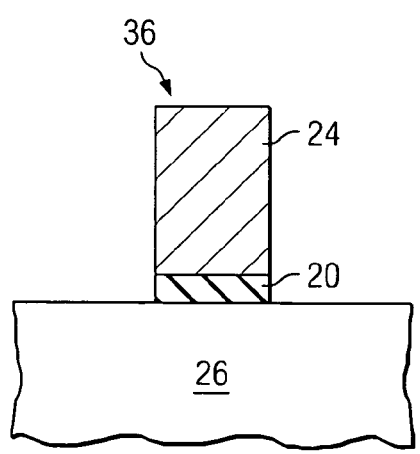

Generally, an embodiment of the present invention provides a method of patterning high-k dielectric material during the fabrication of a semiconductor device. FIGS. 4–6 illustrate a method of patterning a layer 20 of high-k dielectric material in accordance with a first embodiment of the present invention. The example shown in FIGS. 4–6 applies the first embodiment in the context of fabricating a gate for a transistor. Beginning with FIG. 1, an initial unpatterned structure 22 is provided as a starting point, for example. The initial structure 22 has a gate conductor layer 24 over a high-k dielectric layer 20, which is over an underlying layer or a substrate 26.

The gate conductor layer 24 will typically be made from a metal. The gate conductor layer 24 may be made from any of a variety of different materials, including but not limited to: copper, copper alloy, aluminum, aluminum alloy, titanium, titanium nitride, titanium tungsten, tungsten, tungsten nitride, tantalum nitride, nickel, nickel alloy, molybdenum, doped polysilicon, or any combination thereof, for example. The underlying layer 26 may be a substrate made from or based on silicon, for example. The source and drain regions may be formed at some point in the substrate 26 adjacent to the gates to form transistors.

There are many high-k dielectric materials being used, tested, or considered for use as gate dielectric material for transistors, and there will likely be more developed as the use of high-k dielectric materials increases. Also, as mentioned above, high-k dielectric materials are being used or considered for use in other devices as well (e.g., capacitors, FeRAM). Some examples of possible high-k materials include (but are not limited to): aluminum oxide (e.g., $Al_2O_3$), zirconium oxide (e.g., $ZrO_2$), hafnium oxide (e.g., $HfO_2$), hafnium silicate, zirconium silicate, silicon nitride (e.g., $Si_3N_4$), tantalum oxide (e.g., $Ta_2O_5$), barium strontium titanate (e.g., BST), lead-lanthanum-zirconium-titanate (e.g., PLZT—$PbLaTiO_3$), or any combination thereof, for example. The high-k dielectric layer 20 may be deposited using any of a variety of processes, including but not limited to: chemical vapor deposition (CVD), metal-organic chemical vapor deposition (MOCVD), atomic layer deposition (ALD), atomic layer chemical vapor deposition (ALCVD), low pressure chemical vapor deposition (LPCVD), sputtering, anodization, or any combination thereof, for example.

Typically, it is preferred to use a dry etch process (e.g., reactive ion etching or ion milling) for etching the gate conductor layer 24 to provide a substantially vertical profile and good critical dimension control. For example, the plasma etch chemistry for the gate conductor etch may include a combination of $HBr/Cl_2/O_2$ gas flow, which can etch metal but are selective against etching at least some high-k dielectric materials. However, the gate conductor layer 24 may be etched using other processes. FIG. 4 shows a first intermediate structure 32 where the gate conductor layer 24 has been etched in alignment with a patterned hard mask (not shown) and/or a patterned photoresist layer (not shown), for example. The gate conductor etch may or may not be selective against etching the high-k dielectric layer 20. In the example shown in FIG. 4, the gate conductor etch is selective against etching the high-k dielectric layer 20 and the gate conductor etch is stopped when the high-k dielectric layer 20 is reached (e.g., using a timed process or endpoint control).

Figure 2:
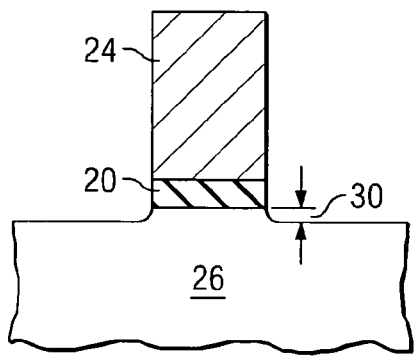
FIGS. 2 and 3 are cross-section views showing damaged and recessed substrate after conventional etching techniques for patterning a high-k dielectric layer.
Figure 3:
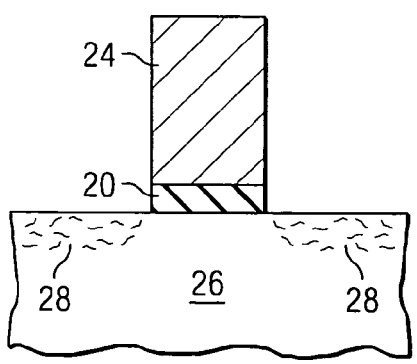

Next, referring to FIG. 5, a first etch is performed on the high-k dielectric layer 20 in alignment with the patterned gate conductor layer 24. The first etch of the high-k dielectric layer 20 may be a dry etching process (e.g., reactive ion etching (RIE), ion milling), for example. In the past, the first etch would be used to completely etch and pattern the high-k dielectric layer 20. However, the results were often unfavorable, as shown in FIGS. 2 and 3 (discussed above). In the first embodiment, portions 34 of the high-k dielectric layer 20 being etched with the first etch remains when the first etch is stopped.

The first etch may be a RIE process using one or more inert gases (e.g., Ar), chlorine-based etch chemistries (e.g., $BCl_3$), fluorine-base etch chemistries (e.g., $CF_4$, $CHF_3$, $CH_2F_2$, $CH_3F$), or any combination thereof, for example. A preferred process for the first etch is performing a plasma etch at a power of about 200–3000 watts, at a pressure of about 5–100 mTorr, with a plasma flow including about 10–200 sccm of $CF_4$ and about 10–100 sccm of $CH_2F_2$, for example. The remaining portions 34 (see FIG. 5) of the high-k dielectric layer 20 may be between about ⅞ and about ⅛ the thickness of the initial high-k dielectric layer 20 (see FIG. 1), for example. The thickness for the remaining portion of the high-k dielectric layer 20 may be between about 20–60 Å, for example. In the first embodiment, the first etch is stopped based on it being a timed process. For example, the dry etching of the first etch is preferably performed for about 10–150 seconds. In other embodiments, the stopping point of the first etch may be provided by an endpoint control function provided by a plasma etching tool. An endpoint control of the first etch may be triggered when surface of the high-k dielectric layer 20 is opened. Whether an endpoint control function can be used will often be dependent upon the plasma recipe for the first etch and/or the material properties of the high-k dielectric material.

After performing the first etch on the high-k dielectric layer 20, a second etch is performed to remove the remaining portions 34 of the high-k dielectric layer 20 in alignment with the patterned gate conductor layer 24. The second etch may be a wet etch process, for example. During the first etch for removing part of the high-k dielectric layer 20, the material properties of the high-k dielectric layer 20 may be changed and/or damaged at the remaining portions 34 during the first etch. However, the second etch of the high-k dielectric layer 20 works better due to these changes in the high-k dielectric layer 20 resulting from the first etch. For example, a wet etching process performed alone on the high-k dielectric layer 20 is not as effective (in most cases) as a wet etching process performed after the material properties of the remaining portions of the high-k dielectric layer 20 have changed during the prior dry etching of the high-k dielectric layer 20. The second etch may be a wet etch using an inorganic acid, for example. The inorganic acid may include, for example, halogen acid, HF, and/or $H_2SO_4$. A preferred process for the second etch is performing a wet etch using a de-ionized $H_2O$ to HF ratio between about 10:1 and about 1000:1, for example. Another preferred process example for the second etch is performing a wet etch using a de-ionized $H_2O$ to $H_2SO_4$ ratio between about 5:1 and about 1000:1. The etching of the gate conductor layer 24 may also affect or change the high-k dielectric layer 20 to some extent.

FIG. 6 shows the gate structure 36 formed after the second etch in accordance with the first embodiment. Preferably, the substrate 26 is not damaged, and has little or no erosion, after the high-k dielectric layer 20 is patterned, which is one of the goals and advantages of the present invention. Also, the first etch and/or the second etch of the high-k dielectric layer 20 is preferably selective against etching the patterned gate conductor layer 24.

Figure 7:
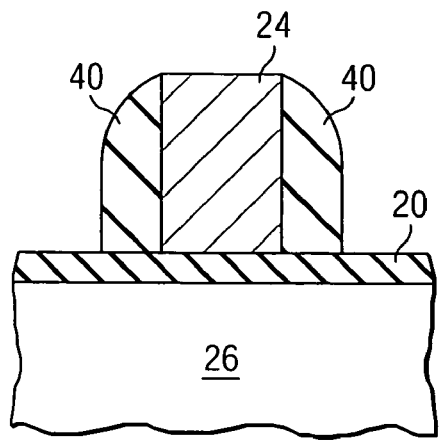
FIGS. 7–9 illustrate a method of patterning a high-k dielectric layer in accordance with a second embodiment of the present invention.
Figure 8:
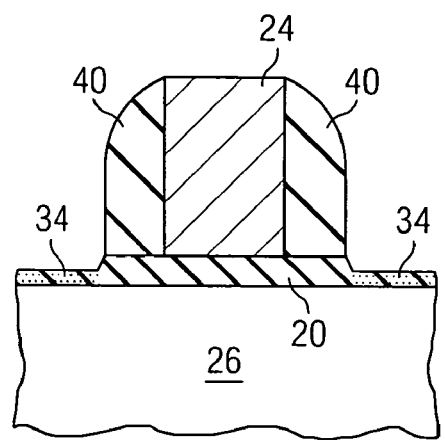
Figure 9:
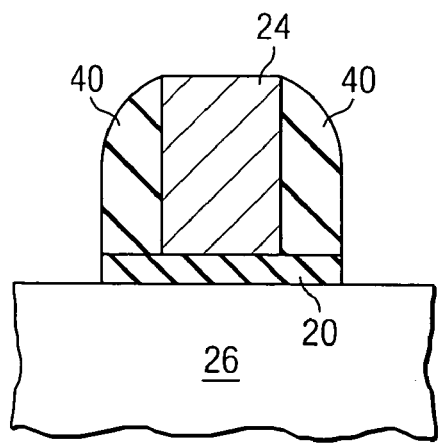

FIGS. 7–9 illustrate a method of patterning a layer 20 of high-k dielectric material in accordance with a second embodiment of the present invention. Referring to FIG. 7, spacers 40 have been formed along sidewalls of the patterned gate conductor layer 24. Then, a first etch of the high-k dielectric layer 20 is performed (as in the first embodiment). The first etch may be performed in alignment with the spacers 40, or in alignment with the spacers 40 (in part) and the patterned gate conductor layer 24 (in part), for example, depending on the placement of the spacers 40. In FIG. 8, the first etch has been performed with the sides being in alignment with the spacers 40. Remaining portions of the etched high-k dielectric layer 20 is changed and/or damaged by the dry etch process of the first etch. Next, a second etch of the high-k dielectric layer 20 is performed (again, as in the first embodiment). The remaining portions of the high-k dielectric layer 20 are removed by the second etch, as shown in FIG. 9, in alignment with the spacers 40 along the sides of the gate. Thus, the second embodiment is essentially the same as the first embodiment with respect to the method used to pattern the high-k dielectric layer 20, except for the alignment.

The etch process used to pattern the spacers 40 also may or may not be used to provide the first etch of the high-k dielectric layer 20. Hence, in some cases the spacer etch may be simply continued after patterning the spacers 40 to etch part of the high-k dielectric layer 20. In other cases, the spacer etch may be selective against etching the high-k dielectric layer 20, which may aid in stopping the spacer etch atop the high-k dielectric layer 20 (e.g., using an endpoint control function).

In accordance with another embodiment of the present invention, and as an optional modification to either of the methods for the first and second embodiments, an additional plasma ashing process may be inserted between the first etch and the second etch. After the first etch of the high-k dielectric layer 20 using a dry etch process, there may be polymer deposits that build up as byproducts from chemical reactions, for example. Whether there will be such polymer deposits depends on the etch chemistry/recipe and the high-k dielectric material chosen for the high-k dielectric layer. For example, using $HfO_2$ as the high-k material may cause polymer buildup with certain dry etch processes. Hence, some first etch processes will produce polymer deposits and some will not.

The problem with the polymer deposits is that a wet etch (e.g., as a second etch for the high-k dielectric layer 20) may not be able to completely remove the polymer buildup. Thus, polymer residue may be left behind after the second etch, which may be undesirable. The plasma ashing process may be used to remove the polymer buildup and/or to improve the wet etch process' ability to remove the polymer buildup and/or residue. One preferred plasma ashing process is to use an $O_2$ flowrate of about 50–500 sccm at a pressure of about 10–500 mTorr and at a power of about 200–3000 watts, for example. Therefore, introducing a plasma ashing process between the first and second etches can improve the overall process of patterning the high-k dielectric layer 20.

The gate conductor etch, the first etch, the plasma ashing, the second etch, or any combination thereof may be performed in a same chamber. The ability to have an in-situ process flow with the same chamber has many process flow advantages (e.g., saving time, less movement of the wafer, preventing exposure to environment, etc.)

It will be appreciated by those skilled in the art having the benefit of this disclosure that embodiments the present invention provide methods of patterning a high-k dielectric layer while minimizing the damage and/or loss to the underlying substrate. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method of fabricating a semiconductor device, comprising:
   providing a layer of high-k dielectric material over a substrate;
   providing a layer of conductive material over the high-k dielectric layer;
   patterning the conductive layer;
   performing a first etch on the high-k dielectric layer, wherein a portion of the high-k dielectric layer being etched with the first etch remains after the first etch;
   plasma ashing a first part of the remaining portion of the high-k dielectric layer; and
   performing a second etch of the high-k dielectric layer to remove a second part of the remaining portion of the high-k dielectric layer, wherein the second etch differs from the first etch, and wherein the plasma ashing is performed after the first etch and before the second etch.

2. The method of claim 1, wherein the first and second etches of the high-k dielectric layer are performed in alignment with the patterned conductive layer.

3. The method of claim 1, wherein the first etch is a dry etch process.

4. The method of claim 1, wherein the second etch is a wet etch process.

5. The method of claim 1, wherein the patterning of the conductive layer, the first etch, and the second etch are performed in a same chamber.

6. The method of claim 1, wherein the patterning of the conductive layer, the first etch, the plasma ashing, and the second etch are performed in a same chamber.

7. The method of claim 1, wherein a second polymer residue is formed after the second etch and as a result of the second etch, and
after the second etch, further comprising plasma ashing the second polymer residue to remove at least pad of the second polymer residue.

8. The method of claim 1, further comprising:
changing material properties of the remaining portion of the high-k dielectric layer during the first etch.

9. The method of claim 1, wherein a polymer residue is formed on the high-k dielectric layer after the first etch, and wherein the plasma ashing removes at least part of the polymer residue.

10. A method of fabricating a semiconductor device, comprising:
providing a layer of high-k dielectric material over a substrate;
providing a layer of conductive material over the high-k dielectric layer;
patterning the conductive layer;
performing a first etch on the high-k dielectric layer, wherein a portion of the high-k dielectric layer being etched with the first etch remains after the first etch, and wherein a first polymer residue is formed on the remaining portion of the high-k dielectric layer after the first etch;
plasma ashing to remove at least part of the first polymer residue from the remaining portion of the high-k dielectric layer; and
performing a second etch of the high-k dielectric layer to remove at least part of the remaining portion of the high-k dielectric layer, wherein the second etch differs from the first etch, and wherein the plasma ashing is performed after the first etch and before the second etch.

11. The method of claim 10, wherein the first and second etches of the high-k dielectric layer are performed in alignment with the patterned conductive layer.

12. The method of claim 10, wherein the first etch is a dry etch process.

13. The method of claim 10, wherein the second etch is a wet etch process.

14. The method of claim 10, wherein the patterning of the conductive layer, the first etch, the plasma ashing, and the second etch are performed in a same chamber.

15. The method of claim 10, wherein the patterning of the conductive layer, the first etch, and the second etch are performed in a same chamber.

16. The method of claim 10, wherein a second polymer residue is formed after the second etch, and further comprising plasma ashing to remove at least part of the second polymer residue.

17. A method of fabricating a semiconductor device, comprising:
providing a layer of high-k dielectric material over a substrate;
providing a layer of conductive material over the high-k dielectric layer;
patterning the conductive layer;
performing a first etch on the high-k dielectric layer, wherein a portion of the high-k dielectric layer being etched with the first etch remains after the first etch;
performing a second etch of the high-k dielectric layer to remove at least part of the remaining portion of the high-k dielectric layer, wherein the second etch differs from the first etch, and wherein a polymer residue is formed after the second etch; and
plasma ashing to remove at least part of the polymer residue.

18. The method of claim 17, wherein the first and second etches of the high-k dielectric layer are performed in alignment with the patterned conductive layer.

19. The method of claim 17, wherein the first etch is a dry etch process.

20. The method of claim 17, wherein the patterning of the conductive layer, the first etch, the second etch, and the plasma ashing are performed in a same chamber.

* * * * *